(12) United States Patent
Happ et al.

(10) Patent No.: US 7,453,081 B2
(45) Date of Patent: Nov. 18, 2008

(54) PHASE CHANGE MEMORY CELL INCLUDING NANOCOMPOSITE INSULATOR

(75) Inventors: Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 1 day.

(21) Appl. No.: 11/490,213

(22) Filed: Jul. 20, 2006

(65) Prior Publication Data
US 2008/0017842 A1   Jan. 24, 2008

(51) Int. Cl.
*H01L 29/04* (2006.01)
(52) U.S. Cl. .............................. 257/3; 257/314; 257/4; 257/E21.003; 977/723; 977/720; 977/785; 977/831
(58) Field of Classification Search ................. 257/1–5, 257/314–326; 977/720, 723, 785, 831
See application file for complete search history.

(56) References Cited

U.S. PATENT DOCUMENTS

| | | | |
|---|---|---|---|
| 2006/0118853 A1* | 6/2006 | Takata et al. ................ | 257/314 |
| 2007/0093564 A1* | 4/2007 | Wernsing et al. .............. | 521/82 |
| 2007/0099377 A1* | 5/2007 | Happ et al. .................. | 438/257 |

FOREIGN PATENT DOCUMENTS

DE    10 2004 014 487 A1    11/2005

OTHER PUBLICATIONS

S.L. Cho et al., "Highly Scalable On-Axis Confined Cell Structure for High Density PRAM beyond 256Mb", 2005 Symposium on VLSI Technology, 2 pgs. (2005).
Giraud et al., "Thermal Characterization and Analysis of Phase Change random Access Memory", Journal of Applied Physics 98, 013520, 7 pgs. (2005).
Hori, H. et al., "A Novel Cell Technology Using N-doped GeSbTe Films for Phase Change RAM", 2003 Symposium on VLSI Technology, 2 pgs. (2003).
Hwang et al., "Full Integration and Reliability Evaluation of Phase-change RAM", Symposium on VLSI Teachnology Digest of Technical Papers, 2 pgs. (2003).
Lai et al., "OUM—A 180nm Nonvolatile Memory Cell Element Technology For Stand Alone and Embedded Applications", IEDM 2001.
Lai et al., "Current Status of the phase change memory and its future", IEDM, 4 pgs (2003).
Pellizzer et al., Novel Trench Phase-Change Memory Cell for Embedded and Stand-Alone Non-Volatile Memory Applications, VLSI, 2 pgs. (2004).
Kim et al., "Thermal boundary resistance at Ge2SbTe5/ZnS:SIOx Interface", Applied Physics Letters, 3 pgs. (2000).
Anzai et al., "Macroscopic Study on Etching Characteristics of Phase-change Recording Films".

* cited by examiner

*Primary Examiner*—Sue A. Purvis
*Assistant Examiner*—Scott R Wilson
(74) *Attorney, Agent, or Firm*—Dicke, Billig, & Czaja, P.L.L.C.

(57) ABSTRACT

A memory cell includes a first electrode, a second electrode, storage material positioned between the first electrode and the second electrode, and a nanocomposite insulator contacting the storage material.

39 Claims, 12 Drawing Sheets

PHASE CHANGE MEMORY CELL INCLUDING NANOCOMPOSITE INSULATOR

BACKGROUND

Semiconductor memories provide memory storage for electronic devices and have become very popular in the electronic products industry. In general, many semiconductor chips are typically fabricated (or built) on a silicon wafer. The semiconductor chips are individually separated from the wafer for subsequent use as memory in electronic devices. In this regard, the semiconductor chips contain an array of memory cells that are configured to store retrievable data, often characterized by the logic values of 0 and 1.

One class of semiconductor memories is resistive memories. They typically use two or more different resistive values of a switchable resistor to define cell states in the memory useful in storing data. One particular type of resistive memory is a phase change memory. In one known structure of a phase change memory cell, the memory cell is formed at the intersection of a phase change memory material and an electrode. Passing energy of an appropriate value through the electrode heats the phase change memory cell, thus affecting a phase/state change in its atomic structure. The phase change memory cell can be selectively switched between logic states 0 and 1, for example, and/or selectively switched between multiple logic states.

Materials that exhibit the above-noted phase change memory characteristics include elements of Group VI of the periodic table (such as Tellurium and Selenium) and their alloys, referred to as chalcogenides or chalcogenic materials. Other non-chalcogenide materials also exhibit phase change memory characteristics.

The atomic structure of one type of phase change memory cell can be switched between an amorphous state and one or more crystalline states. The amorphous state has greater electrical resistance than the crystalline state(s), and typically includes a disordered atomic structure with only short range coordination. In contrast, the crystalline states each generally have a highly ordered atomic structure, and the more ordered the atomic structure of the crystalline state, the lower the electrical resistance (and the higher the electrical conductivity).

The atomic structure of a phase change material becomes highly ordered when maintained at (or slightly above) the crystallization temperature. A subsequent slow cooling of the material results in a stable orientation of the atomic structure in the highly ordered (crystalline) state. To switch back, or reset to the amorphous state, for example in the chalcogenide material, the local temperature is generally raised above the melting temperature (approximately 600 degrees Celsius) to achieve a highly random atomic structure, and then rapidly cooled to "lock" the atomic structure in the amorphous state.

The temperature-induced set/rest changes in memory states may be achieved in a variety of ways. For example, a laser can be directed to the phase change material, current can be driven through the phase change material, or current can be passed through a resistive heater adjacent the phase change material. In any of these methods, controlled heating of the phase change material causes controlled phase change within the phase change material.

The temperature-induced set/rest changes in the memory cell(s) create locally elevated temperatures, or hot spots, within each cell. Ineffective thermal isolation of hot spots in memory cells requires an increase in current (and thus power) to reset a memory state in the memory cell. It is desired to reduce the power needed to change memory states in memory cells to enable the use of smaller selection devices, thus reducing an overall size for memory devices, in general.

For these and other reasons, there is a need for the present invention.

SUMMARY

One aspect of the present invention provides a memory cell. The memory cell includes a first electrode, a second electrode, storage material positioned between the first electrode and the second electrode, and a nanocomposite insulator contacting the storage material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
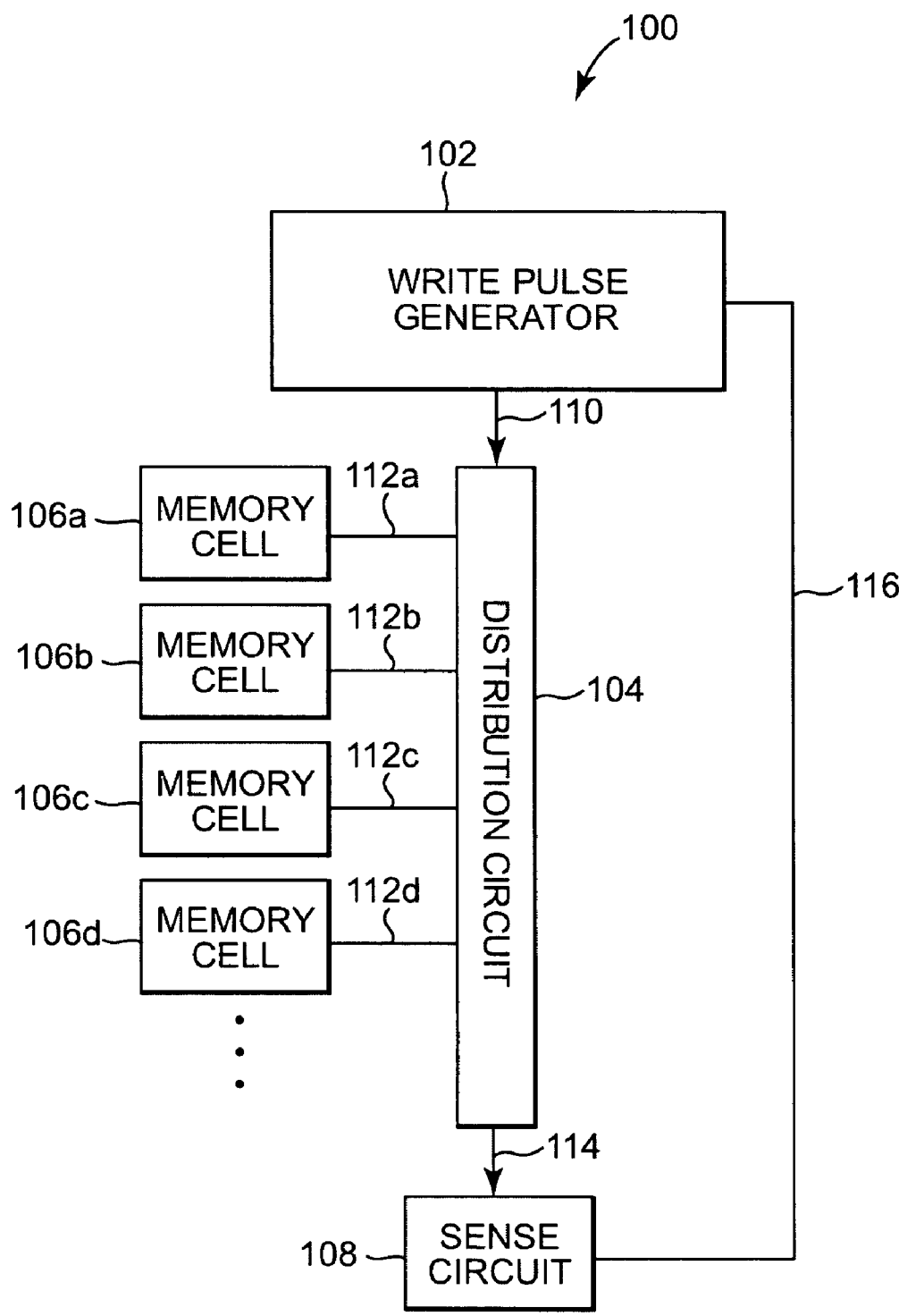
FIG. 1 illustrates a simplified block diagram of a memory device including memory cells according to one embodiment of the present invention.

FIG. 1 illustrates a simplified block diagram of a memory device 100 according to one embodiment of the present invention. Memory device 100 includes a write pulse generator 102, a distribution circuit 104, memory cells 106a, 106b, 106c, and 106d, and a sense circuit 108. In one embodiment, memory cells 106a-106d are phase change memory cells that beneficially employ an amorphous to crystalline phase transition of memory material within the cell for storing data in the memory. Write pulse generator 102 is electrically coupled to distribution circuit 104 through signal path 110. Distribution circuit 104 is electrically coupled to memory cells 106a-106d through signal paths 112a-112d, respectively, and to sense circuit 108 through signal path 114. Write pulse generator 102 is electrically coupled to sense circuit 108 through a signal path 116. Each of the memory cells 106a-106d can be programmed into a memory state associated with a particular resistance value, and the resistance value is controlled using a suitable electrical write strategy.

As employed in this Specification, the term "electrically coupled" is not meant to mean that the elements must be directly coupled together; intervening elements may be provided between the "electrically coupled" elements.

In one embodiment, each phase change memory cell 106a-106d includes a phase change memory element providing a data storage location. The active region for the phase change memory element is where a phase change material of the element transitions between the crystalline state and the amorphous state for storing one bit, 1.5 bits, two bits, or several bits of data.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells.

In one embodiment, memory cells 106a-106d include a phase change material that can be changed from an amorphous state to a crystalline state, or from a crystalline state to an amorphous state, under influence of a temperature change. The degree of crystallinity defines at least two memory states useful for storing data within memory device 100. The memory state(s) can be assigned to the bit values, such as bit values "0" and "1." The bit states of memory cells 106a-106d differ significantly in their electrical resistivity. In the amorphous state, a phase change material exhibits significantly higher resistivity than in the crystalline state. In this manner, sense amplifier 108 reads the cell resistance such that the bit value assigned to a particular memory cell 106a-106d is determined.

To program one of the memory cells 106a-106d within memory device 100, write pulse generator 102 generates a current or voltage pulse for heating the phase change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell heats the phase change material of the target memory cell above its crystallization temperature (but below its melting temperature) long enough to achieve the crystalline state. Generally, a "reset" operation of a memory cell heats the phase change material of the target memory cell above its melting temperature, and then quickly quenches/cools the material, thereby achieving the amorphous state.

The temperature-induced set/rest changes in the memory cell(s) create locally elevated temperatures, or hot spots, within each cell. FIGS. 2-18 illustrate embodiments of phase change memory cells that include a nanocomposite insulator that has a low thermal conductivity that effectively insulates the hot spots in the memory cells. The low thermal conductivity of the nanocomposite insulator is fabricated by combining materials to form a composite that has a combined thermal conductivity that is lower than the thermal conductivity of the individual components that make up the composite. In addition, at least one of the materials in the composite includes a length scale (i.e., a size), for example a nano-sized length scale, that effectively scatters phonons having a length scale associated with heat generated by memory cells. In general, the nanocomposite insulator includes two materials, and at least one of the two materials is nano-sized. The nano-sized material may be a host material that forms a compound with the other, second material; or alternatively, the nano-sized material is distributed within a matrix of a host material.

In one embodiment, the nanocomposite insulator includes a porous insulator host matrix that is infiltrated with a nano-scaled phase change memory material. In another embodiment, the nanocomposite insulator includes a host phase change material having a distribution of insulating nanoparticles. The nanocomposite insulators have a low thermal conductivity that effectively insulates the hot spots in the memory cells by the mechanisms described above. The phase change memory cells including the nanocomposite insulator draw less power in changing memory states in the memory cells, which enables the use of smaller selection devices, and thus reduces an overall size for memory devices.

Figure 2:
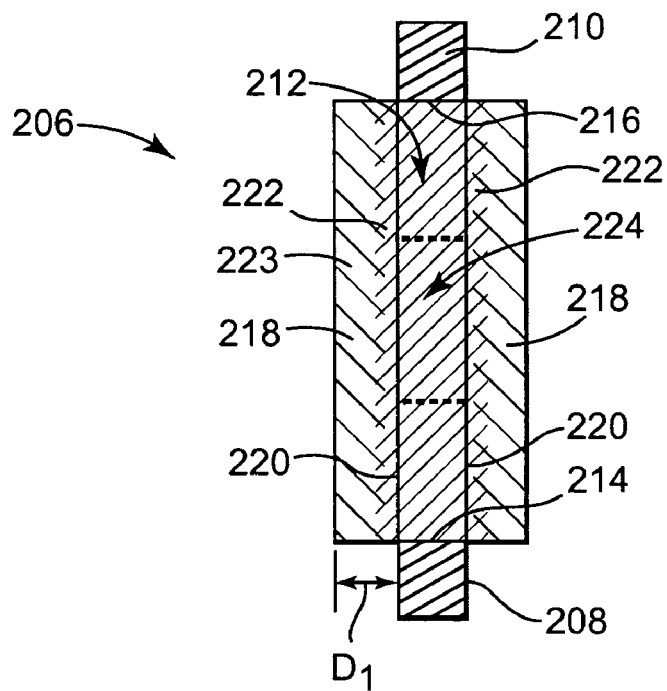
FIG. 2 illustrates a cross-sectional view of a pillar memory cell according to one embodiment of the present invention.

FIG. 2 illustrates a cross-sectional view of a pillar memory cell 206 according to one embodiment of the present invention. Memory cell 206 includes a first electrode 208, a second electrode 210, a phase change memory element 212 extending from a first contact 214 with first electrode 208 to a second contact 216 with second electrode 210, and a nanocomposite insulator 218 contacting phase change memory element 212 along an insulator interface 220. In one embodiment, a portion of nanocomposite insulator 218 adjacent to insulator interface 220 is infiltrated with a phase change material 222.

Memory cell 206 includes upper and lower layers having, for example, a word line, a bit line, and a ground line that electrically connect memory cell 206 to other memory cells in memory device 100 (FIG. 1). For ease of illustration, upper and lower layers are not illustrated in FIGS. 2-4.

A current path is defined through phase change memory element 212 extending from first contact 214 of first electrode 208 through an active region 224 of element 212 to second contact 216 of second electrode 210. Phase change memory element 212 is laterally completely enclosed by nanocomposite insulator 218, such that nanocomposite insulator 218 laterally insulates phase change memory element 212 perpendicular to the current path. In particular, nanocomposite insulator 218 laterally insulates active region 224 perpendicular to the current path.

In one embodiment, nanocomposite insulator 218 is inert (i.e., highly stable to thermal loads and chemical exposure), and includes phase change material 222 in a host insulator material 223. For example, in one embodiment phase change material 222 is substantially similar to phase change material of phase change memory element 212, such that the infiltrated nanocomposite insulator 218 is inert, non-reactive, and compatible with phase change memory element 212.

Figure 3A:
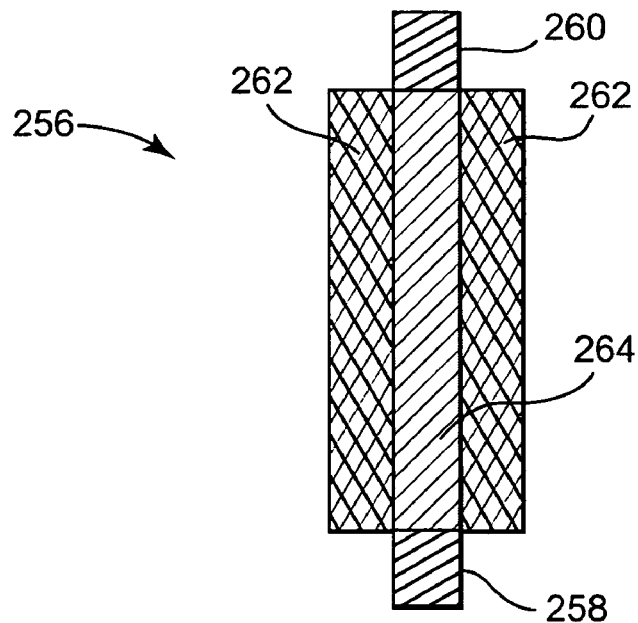
FIG. 3A illustrates a cross-sectional view of a pillar memory cell according to another embodiment of the present invention.
Figure 3B:
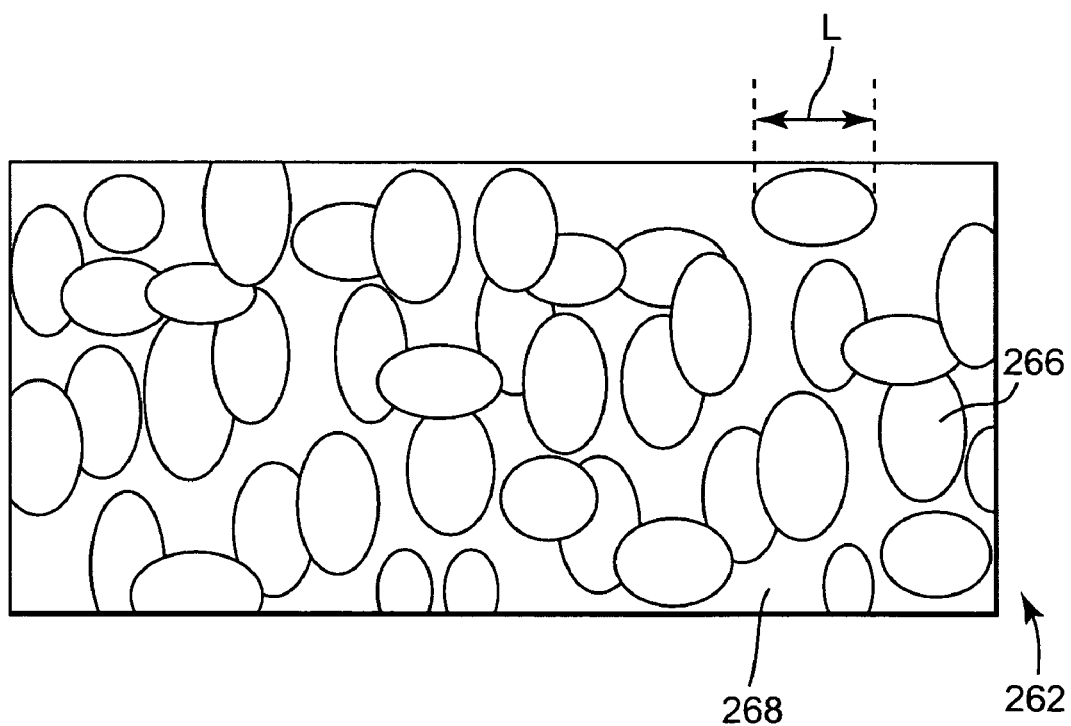
FIG. 3B illustrates a microscopic schematic view of a nanocomposite insulator according to one embodiment of the present invention

Nanocomposite insulator 218 can include a variety of forms. In one embodiment, nanocomposite insulator 218 includes host material 223 and a nano-scaled material distributed within a portion of the host material, such as material 222 as illustrated in FIG. 2. In another embodiment, the host material 223 includes a phase change material and the nano-scaled material includes insulating nanoparticles distributed within host material 223, as illustrated in FIGS. 3A and 3B below. In another embodiment, the host material 223 includes a nanoporous insulator and the nano-scaled material includes particles infiltrated into the nano-sized pores of the porous insulator. In at least one embodiment, nanocomposite insulator 218 is deposited as a layer having a thickness of between about 3-30 nm.

Phase change memory element 212 provides a storage location for storing one bit or several bits of data. A selection device, such as an active device like a transistor or diode can be coupled to first electrode 208 to control the application of current or voltage through first electrode 208 during set and reset of phase change memory element 212.

During a set operation of phase change memory element 212, a set current or voltage pulse is selectively delivered to phase change memory element 212 to heat it above its crystallization temperature (but usually below its melting temperature). In this manner, phase change memory element 212 is selectively set to a crystalline state during set operation. During a reset operation of phase change memory element 212, a reset current or voltage pulse is selectively delivered by the selection device through first electrode 208 to phase change memory element 212. The reset current or voltage quickly heats phase change memory element 212 above its melting temperature, and then phase change memory element 212 is quickly quenched/cooled to achieve its amorphous or reset state.

During the reset operation, phase change memory element 212 typically begins heating and changing phases (melting) from a center of the cell.

In one embodiment, nanocomposite insulator 218 has varying material composition on a nano-sized length scale (i.e., a portion of the material composition is nano-scaled) which is approximately equal to the phonon wavelength associated with the heat generated in memory cell 206. In one embodiment, the nano-sized length scale is between about 0.5 to 10 nm, and preferably, the nano-sized length scale is between about 1-5 nm. In another embodiment, nanocomposite insulator 218 is a nanocomposite matrix/cluster defining a cluster size of between about 1-5 nm, as best illustrated in FIG. 3B below. The nano-scaled materials very effectively scatter the phonons of heat energy at that particular wavelength, thus effectively lowering the thermal conductivity of the nanocomposite insulator 218. Nanocomposite insulator 218 contacts phase change memory element 212 along insulator interfaces 220, and insulates phase change memory element 212 to enable element 212 to melt/change phases through an entirety of element 212 between insulator interfaces 220. As a result, phase change memory element 212 experiences a near maximum resistance after RESET, which leads to a large signal contrast.

In one embodiment, first electrode 208 is provided as an electrode plug within a portion of a pre-processed wafer (not illustrated). In another embodiment, first electrode 208 is a dedicated electrode upon which remaining portions of memory cell 206 are fabricated. Electrodes 208/210 include titanium nitride (TiN), tungsten (W), or other suitable electrode material. In one embodiment, first electrode 208 is an electrode plug including TiN, a tungsten plug, a copper plug, or a plug of other suitable electrode material.

Phase change material element 212 includes phase change material selected from a variety of suitable materials in accordance with the present invention. In one embodiment, phase change material element 212 includes chalcogenide alloys having one or more elements from Group VI of the Periodic Table. For example, in one embodiment phase change material of element 212 includes a chalcogenide compound such as GeSbTe, SbTe, GeTe, or AgInSbTe. In another embodiment, the phase change material of element 212 is chalcogen-free, and includes compounds such as GeSb, GaSb, InSb, or GeGaInSb. In other embodiments, the phase change material of phase change memory element 212 includes suitable phase change material having one or more of the elements Ge, Sb, Te, Ga, As, In, Se, and S.

In one embodiment, nanocomposite insulator 218 is a porous host matrix characterized by an inert and electrically insulating material defining pores. In one embodiment, the pores are nano-scaled in size. In one embodiment, nanocomposite insulator 218 includes a host material of, for example, SiO2, $GeO_x$ (where "x" is a non-zero integer), $Al_2O_3$, SiN, SiON, or SiOCH and is infiltrated with a nano-scaled phase change material 222. In one embodiment, phase change material 222 is the same phase change material contained within the phase change memory element 212. In another embodiment, phase change material 222 is a different phase change material than the material used in phase change memory element 212. Concentrations of relative amounts of host material and nano-scaled material can be selectively chosen such that the resultant nanoporous insulator has a lower thermal conductivity than any one of its components.

In one embodiment, nanocomposite insulator 218 defines a thickness D1 of between about 10-50 nm and includes a matrix of pores that define a nano-scaled pore size of between about 1-5 nm. In one embodiment, a portion of the matrix of pores, preferably adjacent to interface 220, is infused/infiltrated with phase change material 222. In another embodiment, an entirety of the matrix of pores is infused/infiltrated with phase change material 222. In one embodiment, nanocomposite insulator 218 laterally and completely surrounds active region 224 of phase change memory element 212.

In one embodiment, phase change memory element 212 includes a chalcogenide material, and phase change material 222 includes the same chalcogenide material. In another embodiment, phase change memory element 212 includes a chalcogenide material, and phase change material 222 includes a different chalcogenide material. In one embodiment, phase change memory element 212 includes a chalcogen-free material, and phase change material 222 of nanocomposite insulator 218 includes the same chalcogen-free material. In another embodiment, phase change memory element 212 includes chalcogen-free material, and phase change material 222 of nanocomposite insulator 218 includes a different chalcogen-free material. In another embodiment, phase change memory element 212 includes a chalcogen material, and phase change material 222 of nanocomposite insulator 218 includes a chalcogen-free material. In another embodiment, phase change memory element 212 includes a chalcogen-free material, and phase change material 222 of nanocomposite insulator 218 includes a chalcogenide.

Figure 4:
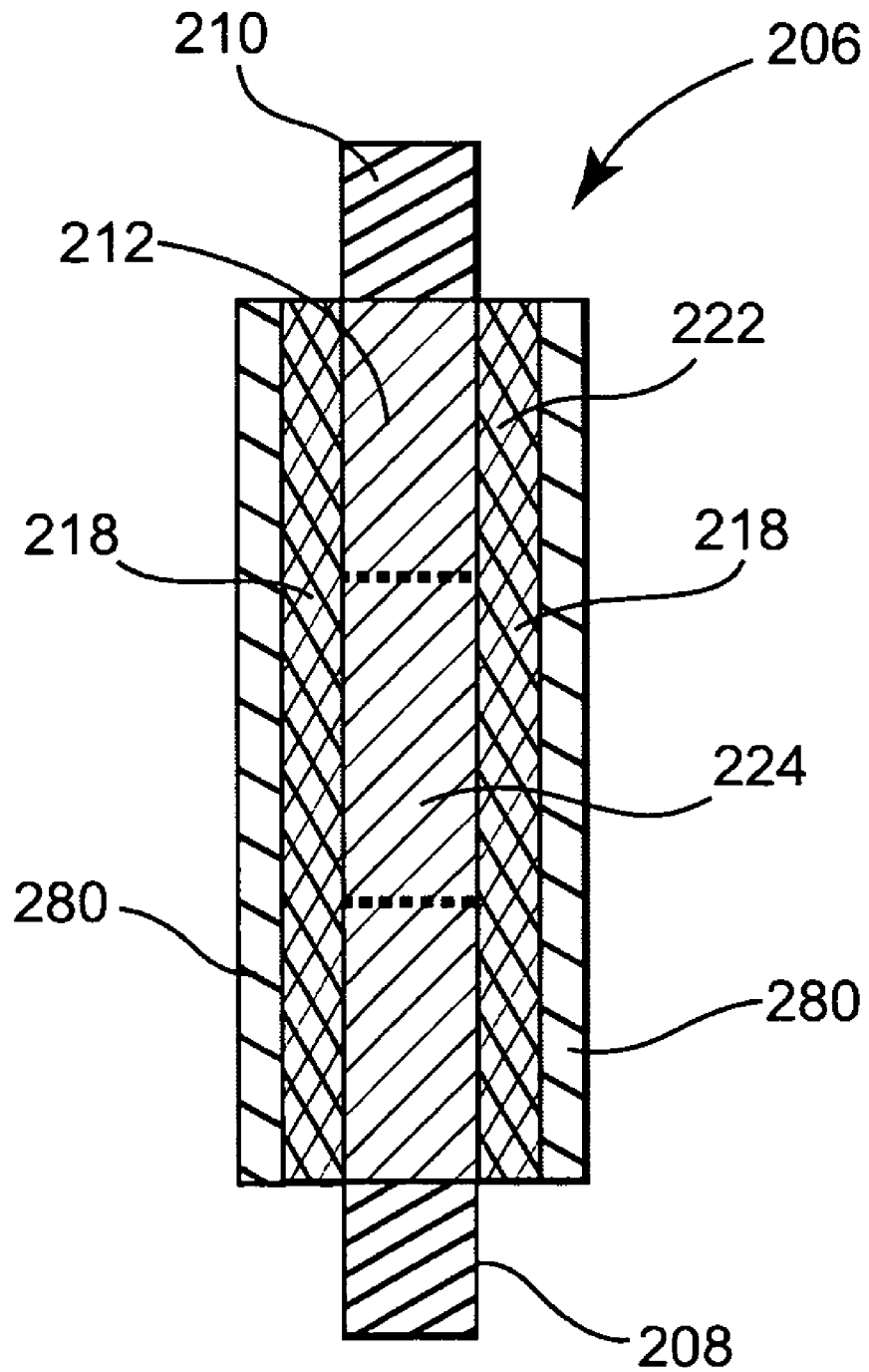
FIG. 4 illustrates a cross-sectional view of a pillar memory cell including an encapsulation layer according to one embodiment of the present invention.

Pillar memory cells including the nanocomposite insulator can be fabricated in a variety of methods as illustrated in FIGS. 2-4. For example, in one embodiment memory cell 206 is a heater cell fabricated in layers, or built up, on a preprocessed wafer starting from first electrode 208 and continuing through second electrode 210 (and other upper layers, not illustrated). In one embodiment, phase change memory element 212 is defined between electrodes 208, 210 in appropriate etch and strip processes to define a sub-lithographically small lateral dimension. Thereafter, nanocomposite insulator 218 is deposited adjacent to and in contact with phase change memory element 212.

In one embodiment, phase change material of phase change memory element 212 diffuses across insulator interface 220 and infiltrates into pores of nanocomposite insulator 218. In one embodiment, a systematic intradiffusion cycle, for example a rapid thermal anneal cycle, is employed to energetically and thermally drive some of the phase change material of phase change memory element 212 into pores of nanocomposite insulator 218.

In one embodiment, nanocomposite insulator 218 is deposited using chemical vapor deposition (CVD), atomic layer deposition (ALD), metal organic chemical vapor deposition (MOCVD), plasma vapor deposition (PVD), jet vapor deposition (JVD), or other suitable deposition techniques.

In one embodiment, nanocomposite insulator 218 is deposited to define a thin layer D1 selected such that diffusion of phase change material from phase change memory element 212 completely fills pores of nanocomposite insulator 218. In this manner, host layer nanocomposite insulator 218 is sealed with phase change material 222 and further diffusion is limited. Consequently, nanocomposite insulator 218 is infiltrated with phase change material and defines a highly stable insulating material layer around active region 224.

FIG. 3A illustrates a cross-sectional view of a pillar memory cell 256 according to another embodiment of the present invention. Memory cell 256 includes a first electrode 258, a second electrode 260, a phase change memory element 264 positioned between electrodes 258, 260, and a volume of nano-compound alloy 262 deposited around phase change memory element 264.

In one embodiment, nano-compound alloy 262 is a nanocomposite insulator that includes an alloy of phase change material and insulating material deposited in a single deposition process. In one embodiment, nano-compound alloy 262 includes a phase change host material selected from one of the suitable phase change materials identified above, for example a compound including one or more of the elements Ge, Sb, Te, Ga, As, In, Se, and S, and an insulator material selected from a suitable insulator material, for example, $SiO2$, $GeO_x$, GeN, or SiN material, that embed as nanoparticles of insulator within the phase change host material. In one embodiment, nano-compound alloy 262 is a homogenous distribution of phase change material and insulator material that is deposited and subsequently annealed, for example, to precipitate nano-sized particles of insulator material in the phase change material.

In one embodiment, nano-compound alloy 262 includes a GST (i.e., $Ge_xSb_xTe_x$) phase change material having high alloy levels of oxygen, or high levels of silicon dioxide. In one embodiment, germanium oxide nano-scaled particles are precipitated from the nano-compound alloy 262 such that the GST phase change host material is segregated to form an inert oxygenated matrix including nanoparticles of insulator materials. For example, in one embodiment nano-compound alloy 262 of GeSbTe:O is deposited around memory element 265 in a single process, and nanoparticles of GeO insulators precipitate into the phase change host material matrix. In another embodiment, nano-compound alloy 262 is an alloy of GST: $SiO_2$, and a precipitate of germanium oxide (GeO) nanoparticles are distributed within a phase change host material matrix.

FIG. 3B illustrates a microscopic schematic view of a nanocomposite insulator formed by deposition of nano-compound alloy 262 according to one embodiment of the present invention. After deposition of the highly doped phase change material, for example, highly $SiO2$, $O2$, $N2$, or SiN-doped phase change material, insulation nanoparticles 266 precipitate and/or distribute within a phase change material host matrix/cluster 268. In general terms, nanoparticles 266 define a dimension L that is nano-scaled such that cluster 268 is nano-scaled. In one embodiment, cluster 268 defines a cluster size in which the dimension L ranges between about 0.5-10 nm, preferably the dimension L ranges between about 1-5 nm. It is to be understood that nano-particles can be nano-scaled with length dimension L in a variety of suitable shapes, including elliptical shapes (as illustrated), uniform spheres, non-uniform spheres, and other shapes associated with precipitates of one material in another.

Suitable relative concentrations of insulation material 266 to phase change matrix 268 material are selected to selectively adjust electrical insulation properties of nanocomposite insulator 262. For example, in one embodiment a concentration of insulation material is greater than a concentration of matrix material. However, depending on the desired insulation property, a concentration of insulation material is selected to be less than a concentration of matrix material, or the concentrations can be selected to be substantially equal. In one embodiment, nanocomposite insulators formed of such nano-compound alloys are characterized as having a bulk thermal insulation property that is lower than a thermal insulation property of any one of the constituent components.

FIG. 4 illustrates memory cell 206 including an encapsulation layer 280 according to one embodiment of the present invention. In one embodiment, encapsulation layer 280 is deposited to insulatively cover and enclose an entirety of nanocomposite insulator 218. In one embodiment, encapsulation layer 280 is a diffusion blocking layer that minimizes diffusion of phase change material 222 from phase change memory element 212 through nanocomposite insulator 218. In one embodiment, encapsulation layer 280 includes SiN, SiON, AlN, $TiO_2$, $Al_2O$, or other suitable dialect materials having a generally higher thermal conductivity than nanocomposite insulator 218. In one embodiment, phase change material 222 diffuses through an entirety of insulator 218 to form a nanocomposite insulator.

Encapsulation layer 280 can be deposited using one of CVD, ALD, MOCVD, PVD, JVD, or other suitable deposition techniques, as described above.

Figure 5:
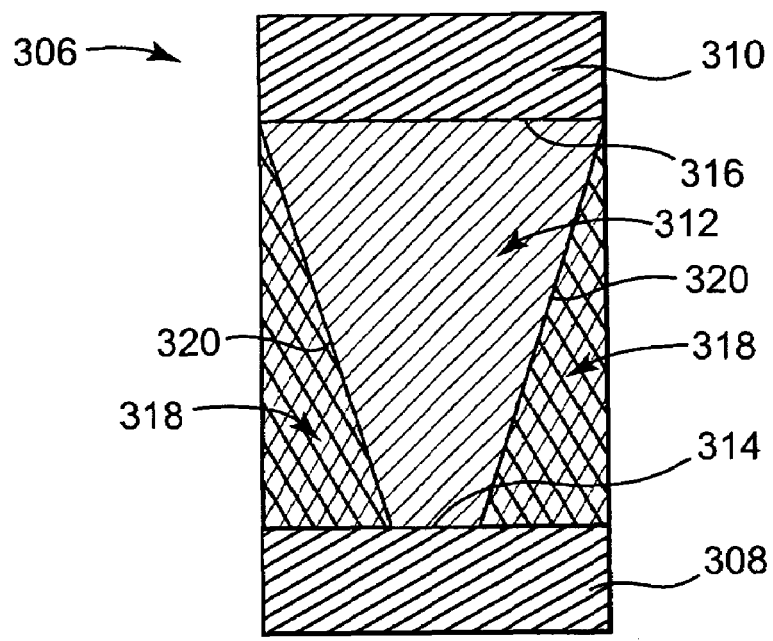
FIG. 5 illustrates a cross-sectional view of a V-cell memory cell according to one embodiment of the present invention.

FIG. 5 illustrates a cross-sectional view of a V-cell memory cell 306 according to one embodiment of the present invention. Memory cell 306 includes a first electrode 308, a second electrode 310, a phase change memory element 312 extending from a first contact 314 with first electrode 308 to a second contact 316 with second electrode 310, and a nanocomposite insulator 318 contacting phase change memory element 312 along an insulator interface 320.

Memory cell 306 includes upper and lower layers having, for example, a word line, a bit line, and a ground line that electrically connect memory cell 306 to other memory cells in memory device 100 (FIG. 1). For ease of illustration, upper and lower layers are not illustrated in FIGS. 5-7.

A current path is defined through phase change memory element 312 extending from first contact 314 of first electrode 308 through an active region of element 312 to second contact 316 of second electrode 310. Phase change memory element 312 is laterally completely enclosed by nanocomposite insulator 318, such that nanocomposite insulator 318 laterally insulates phase change memory element 312 perpendicular to the current path. In particular, nanocomposite insulator 318 laterally insulates active region of memory element perpendicular to the current path.

For example, in one embodiment, nanocomposite insulator 318 includes a host material and a nano-scaled material distributed within a portion of the host material. In another embodiment, the host material includes a phase change material and the nano-scaled material includes insulating nanoparticles distributed within host material, such as illustrated in FIG. 3A above. In another embodiment, the host material includes a nanoporous insulator and the nano-scaled material includes particles infiltrated into the nano-sized pores of the porous insulator.

In one embodiment, electrodes 308, 310 are similar to electrodes 208/210 (FIG. 2) and include titanium nitride (TiN), tungsten (W), or other suitable electrode material. In one embodiment, first electrode 308 is an electrode plug including TiN, a tungsten plug, a copper plug, or a plug of other suitable electrode material.

In one embodiment, phase change element 312 includes chalcogenide alloys having one or more elements from Group VI of the Periodic Table. For example, in one embodiment phase change material of element 312 includes a chalcogenide compound such as GeSbTe, SbTe, GeTe, or AgInSbTe. In another embodiment, the phase change material of element 312 is chalcogen-free, and includes GeSb, GaSb, InSb, or GeGaInSb. In other embodiments, the phase change material of phase change memory element 312 includes suitable phase change material having one or more of the elements Ge, Sb, Te, Ga, As, In, Se, and S.

In one embodiment, nanocomposite insulator 318 is deposited as a nano-compound alloy 332 in a single process deposition, similar to the processing of nano-compound alloy 262 described above in FIG. 3A. In one embodiment, germanium oxide nano-scaled particles are precipitated from the nano-compound alloy 332 such that a GST phase change host material is segregated to form an inert oxygenated matrix including nanoparticles of insulator materials. For example, in one embodiment nano-compound alloy 332 of GeSbTe:O is deposited around memory element 312, and nanoparticles of GeO insulators precipitate into the remaining phase change host material matrix. In another embodiment, nano-compound alloy 332 is an alloy of GST:SiO$_2$, and a precipitate of germanium oxide (GeO) nanoparticles are distributed within a phase change host material matrix.

Figure 6:
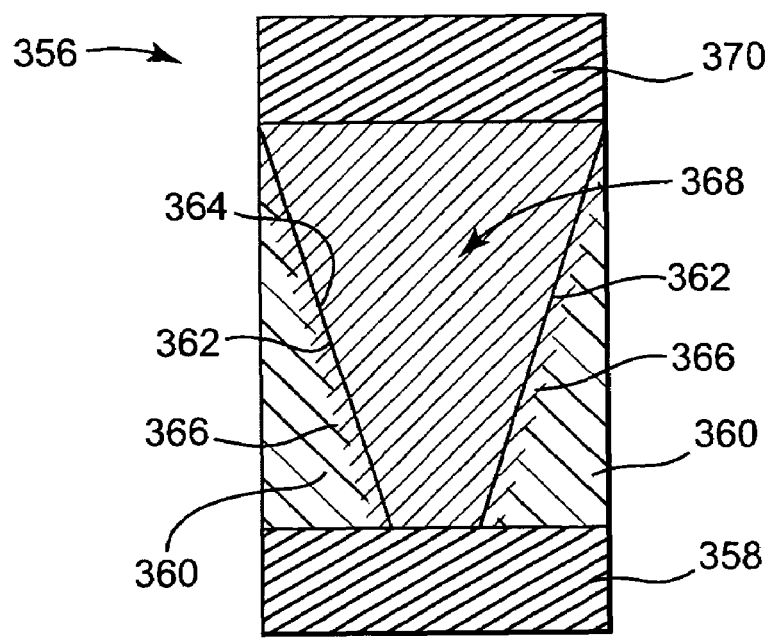
FIG. 6 illustrates a cross-sectional view of a V-cell memory cell according to another embodiment of the present invention.

FIG. 6 illustrates a cross-sectional view of a V-cell memory cell 356 according to another embodiment of the present invention. Memory cell 356 includes a first electrode 358 upon which various other layers of memory cell 356 are fabricated.

For example, in one embodiment a layer 360 of insulator is deposited on first electrode 358. In one embodiment, layer 360 is a layer of nanoporous host insulator material that includes nano-scaled pores. Layer 360 of nanoporous insulator is subsequently etched, for example lithographically etched, and/or processed to define a V-shaped via defined by face 362. In this manner, a V-shaped well defined by face 362 is formed in layer 360 of insulator material. In one embodiment, phase change material 366 is deposited onto face 362 of nanoporous insulator 360 by a suitable deposition process, such as ALD, CVD, PVD, or deposited by another suitable deposition technique to fabricate a nanocomposite insulator around a phase change memory element 368.

In one embodiment, nanocomposite insulator 360 is a porous matrix that defines pores having a pore size of between about 1-5 nm, where a portion of the pores, preferably adjacent to interface 362, are infused with phase change material 366.

In one embodiment, a monolayer of phase change material 364 is deposited onto face 362 of insulator 360 by atomic layer deposition (ALD). During such ALD deposition, the phase change material 364 diffuses into the nanoporous insulator 360 monolayer per monolayer to selectively infiltrate insulator 360 with phase change material 366 and form a nanocomposite insulator.

In one embodiment, a phase change material 364 is deposited into the via of nanoporous insulator 360 defined by face 362, and additional thermal cycling or thermal annealing is applied to further enhance diffusion of phase change material 364 into nanoporous insulator 360. In this regard, phase change material 364 and phase change material 366 are the same phase change material.

In one embodiment, nanocomposite insulator 360 is inert, and includes phase change material 366 that is the same as a phase change material of phase change memory element 368. In another embodiment, nanocomposite insulator 360 includes phase change material 366 that is different than phase change material employed in phase change memory element 368. In this regard, nanocomposite insulator 360 is similar to nanocomposite insulator 218 described above in FIGS. 2 and 4. The phase change materials are as described above, and can include chalcogen or chalcogen-free materials.

Figure 7:
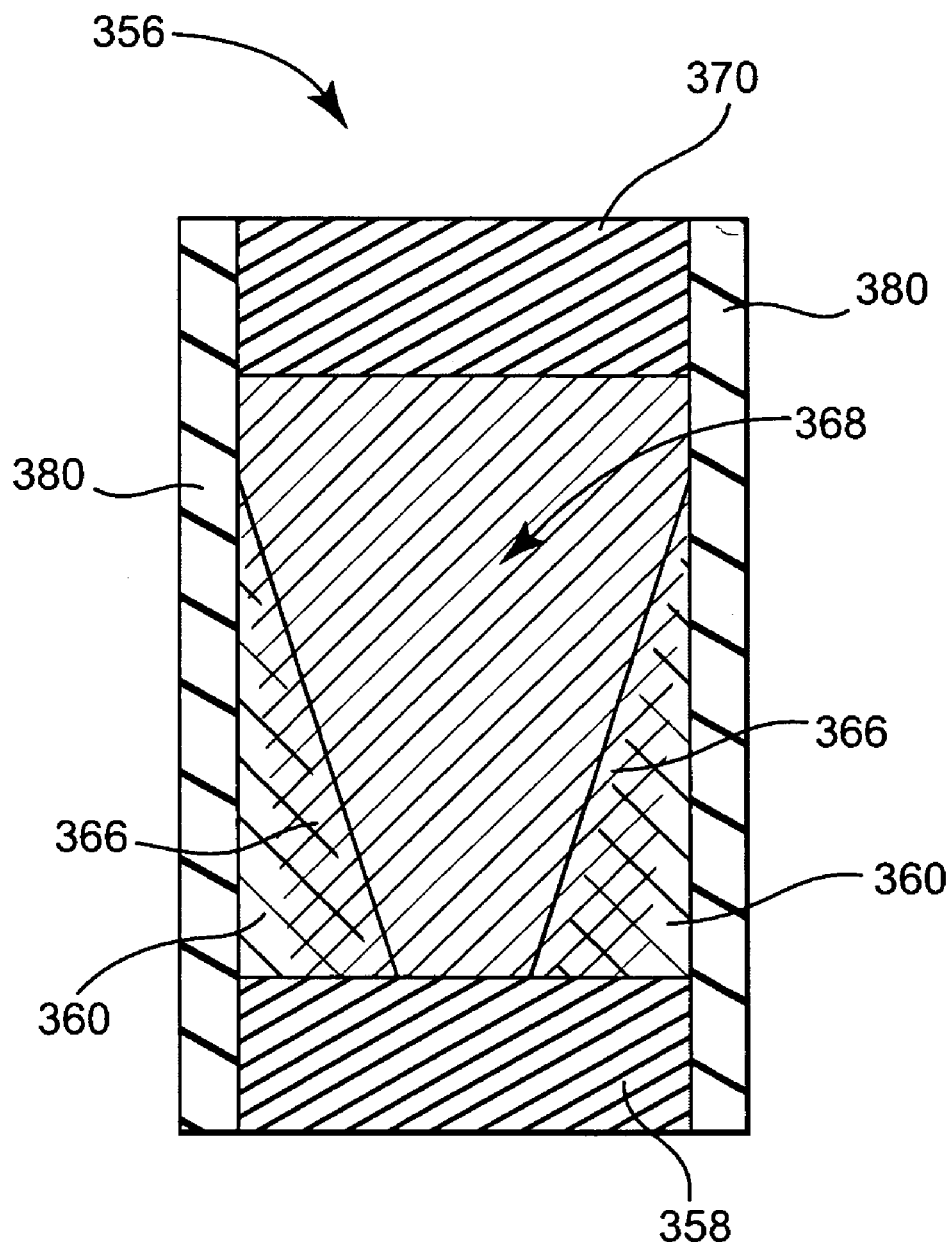
FIG. 7 illustrates a cross-sectional view of a V-cell memory cell including an encapsulation layer according to one embodiment of the present invention.

FIG. 7 illustrates a cross-sectional view of memory cell 356 including an encapsulation layer 380 according to one embodiment of the present invention. Memory cell 356 includes phase change memory element 368 extending between first electrode 358 and second electrode 370, and nanoporous insulator 360 infiltrated with phase change material 366. In one embodiment, encapsulation layer 380 surrounds memory cell 356 and phase change material 366 diffuses through an entirety of insulator 360 to form a nanocomposite insulator. In one embodiment, encapsulation layer 380 is a low-k dielectric layer deposited employing a CVD, ALD, MOCVD, PVD, JVD, or other suitable deposition technique.

Figure 8:
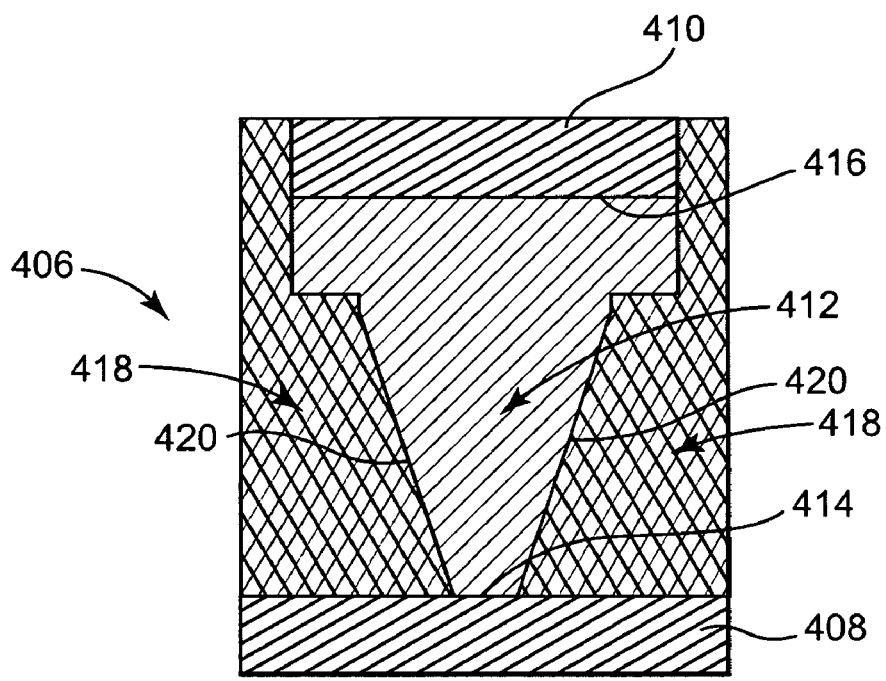
FIG. 8 illustrates a cross-sectional view of a mushroom-in-via memory cell according to one embodiment of the present invention.

FIG. 8 illustrates a cross-sectional view of a mushroom-in-via memory cell 406 according to one embodiment of the present invention. Memory cell 406 includes a first electrode 408, a second electrode 410, a phase change memory element 412 extending from a first contact 414 with first electrode 408 to a second contact 416 with second electrode 410, and a nanocomposite insulator 418 contacting phase change memory element 412 along an insulator interface 420.

Memory cell 406 includes upper and lower layers having, for example, a word line, a bit line, and a ground line that electrically connect memory cell 406 to other memory cells in memory device 100 (FIG. 1). For ease of illustration, upper and lower layers are not illustrated in FIGS. 8-10.

A current path is defined through phase change memory element 412 extending from first contact 414 of first electrode 408 through an active region of element 412 to second contact 416 of second electrode 410. Phase change memory element 412 is laterally enclosed by nanocomposite insulator 418, such that nanocomposite insulator 418 laterally insulates phase change memory element 412 perpendicular to the current path. In particular, nanocomposite insulator 418 laterally insulates an active region of phase change memory element 412 perpendicular to the current path.

In one embodiment, nanocomposite insulator 418 includes a host material and a nano-scaled material distributed within a portion of the host material. In another embodiment, the host material includes a phase change material and the nano-scaled material includes insulating nanoparticles distributed within host material, such as illustrated in FIG. 3A above. In another embodiment, the host material includes a nanoporous insulator and the nano-scaled material includes particles infiltrated into the nano-sized pores of the porous insulator.

Electrodes 408, 410 are similar to electrodes 208/210 (FIG. 2) and include titanium nitride (TiN), tungsten (W), or other suitable electrode material. In one embodiment, first electrode 408 is an electrode plug including TiN, a tungsten plug, a copper plug, or a plug of other suitable electrode material.

In one embodiment, phase change element 412 includes a chalcogenide alloy of phase change material having one or more elements from Group VI of the Periodic Table. For example, in one embodiment phase change material of element 412 includes a chalcogenide compound such as GeSbTe, SbTe, GeTe, or AgInSbTe. In another embodiment, the phase change material of element 412 is chalcogen-free, and includes GeSb, GaSb, InSb, or GeGaInSb. In other embodiments, the phase change material of phase change memory element 412 includes suitable phase change material having one or more of the elements Ge, Sb, Te, Ga, As, In, Se, and S.

In one embodiment, nanocomposite insulator 418 is a porous host matrix characterized by an inert and electrically insulating material, substantially similar to nanocomposite insulator 218 (FIG. 2). In one embodiment, nanocomposite insulator 418 includes a host matrix material of $SiO_2$, $GeO_x$, $Al_2O_3$, SiN, SiON, or SiOCH and is infiltrated with a phase change material 422, and phase change material 422 is the same phase change material contained within the phase change memory element 412. In another embodiment, phase change material 422 is a different phase change material than the material used in phase change memory element 412.

In another embodiment, nanocomposite insulator 418 is deposited as a nano-compound alloy in a single deposition, similar to the processing of nano-compound alloy 262 described above in FIG. 3A. Nanocomposite insulator 418 can be fabricated in a variety of ways. For example, in one embodiment, germanium oxide nano-scaled particles are precipitated from the nano-compound alloy such that a GST phase change host material is segregated to form an inert oxygenated matrix including nanoparticles of insulator materials.

For example, in one embodiment nano-compound alloy of GeSbTe:O is fabricated around memory element 412 in a single process, and nanoparticles of GeO insulators precipitate into the remaining phase change host material matrix to form nanocomposite insulator 418. In another embodiment, nano-compound alloy is an alloy of $GST:SiO_2$, and a precipitate of germanium oxide (GeO) nanoparticles are distributed within a phase change host material matrix.

Figure 9:
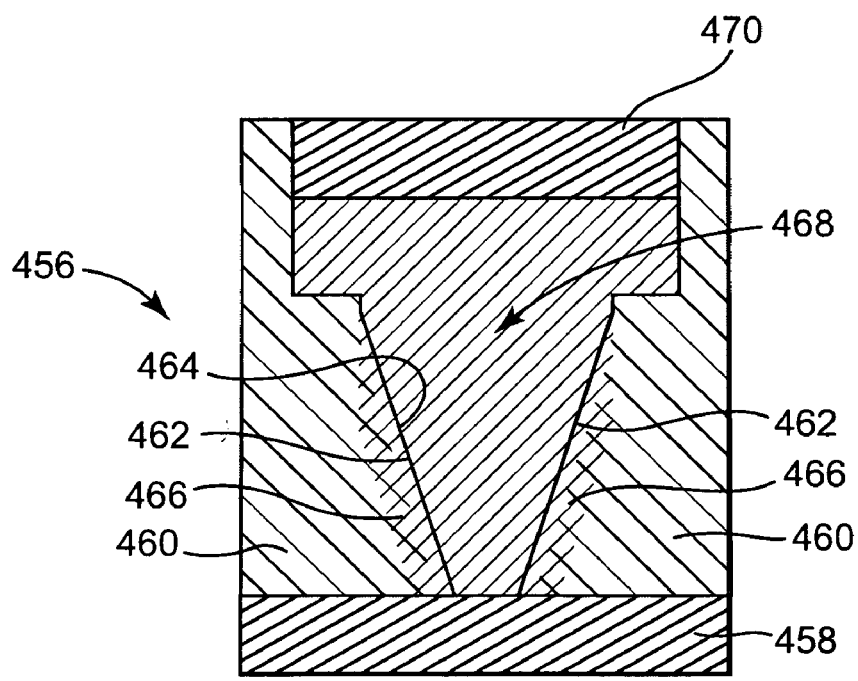
FIG. 9 illustrates a cross-sectional view of a mushroom-in-via memory cell according to another embodiment of the present invention.

FIG. 9 illustrates a cross-sectional view of a mushroom-in-via memory cell 456 according to another embodiment of the present invention. Memory cell 456 includes a first electrode 458 upon which various other layers of memory cell 456 are fabricated.

For example, in one embodiment a layer 460 of insulator is deposited on first electrode 458. In one embodiment, layer 460 is a nanoporous insulator layer. Layer 460 of insulator is etched, for example lithographically etched, and/or processed to define a V-shaped via defined by face 462. In this manner, a V-shaped well defined by face 462 is formed in layer 460 of insulator. In one embodiment, phase change material 464 is deposited onto face 462 of insulator 460 by a suitable deposition process, such as ALD, CVD, PVD, or deposited by another suitable deposition technique to form a nanocomposite insulator.

In one embodiment, a monolayer of phase change material 464 is deposited onto face 462 of insulator 460 by atomic layer deposition (ALD). During such ALD deposition, the phase change material 464 diffuses into the nanoporous insulator 460 monolayer per monolayer to selectively infiltrate insulator 460 with phase change material 466 and form a nanocomposite insulator in contact with memory element 468. In this regard, memory element 468 and the nanocomposite insulator share a common interface that insulates memory element and closes or diminishes gap formation between memory element 468 and nanocomposite insulator.

In one embodiment, a phase change material 464 is deposited into the via of insulator 460 defined by face 462, and additional thermal cycling or thermal annealing is applied to further enhance diffusion of phase change material 464 into insulator 460. In this regard, phase change material 464 and phase change material 466 are the same phase change material.

In one embodiment, phase change material 464 is deposited into the via defined by face 462 to define a phase change memory element 468. In a subsequent fabrication process, a second electrode 470 is deposited onto phase change memory element 468 to define a memory cell 456 that includes first electrode 458, second electrode 470, phase change memory element 468 extending from first electrode 458 to second electrode 470, and a nanocomposite insulator 460 contacting phase change memory element 468. A portion of nanocomposite insulator 460 is infiltrated with phase change material 466, and phase change material 466 can be the same or different from phase change material 464.

In one embodiment, insulator 460 is porous and defines a pore size of between about 1-5 nm, where a portion of the pores, preferably adjacent to interface 420, are infused with phase change material 466.

Regarding the nano-sized particles in the nanocomposite insulator, in one embodiment phase change memory element 468 includes a chalcogenide material, and phase change material 466 includes the same chalcogenide material. In another embodiment, phase change memory element 468 includes a chalcogenide material, and phase change material 466 includes a different chalcogenide material. In one embodiment, phase change memory element 468 includes a chalcogen-free material, and phase change material 466 includes the same chalcogen-free material. In another embodiment, phase change memory element 468 includes chalcogen-free material, and phase change material 466 includes a different chalcogen-free material. In another embodiment, phase change memory element 468 includes a chalcogen material, and phase change material 466 includes a chalcogen-free material. In another embodiment, phase change memory element 468 includes a chalcogen-free material, and phase change material 466 includes a chalcogenide.

Figure 10:
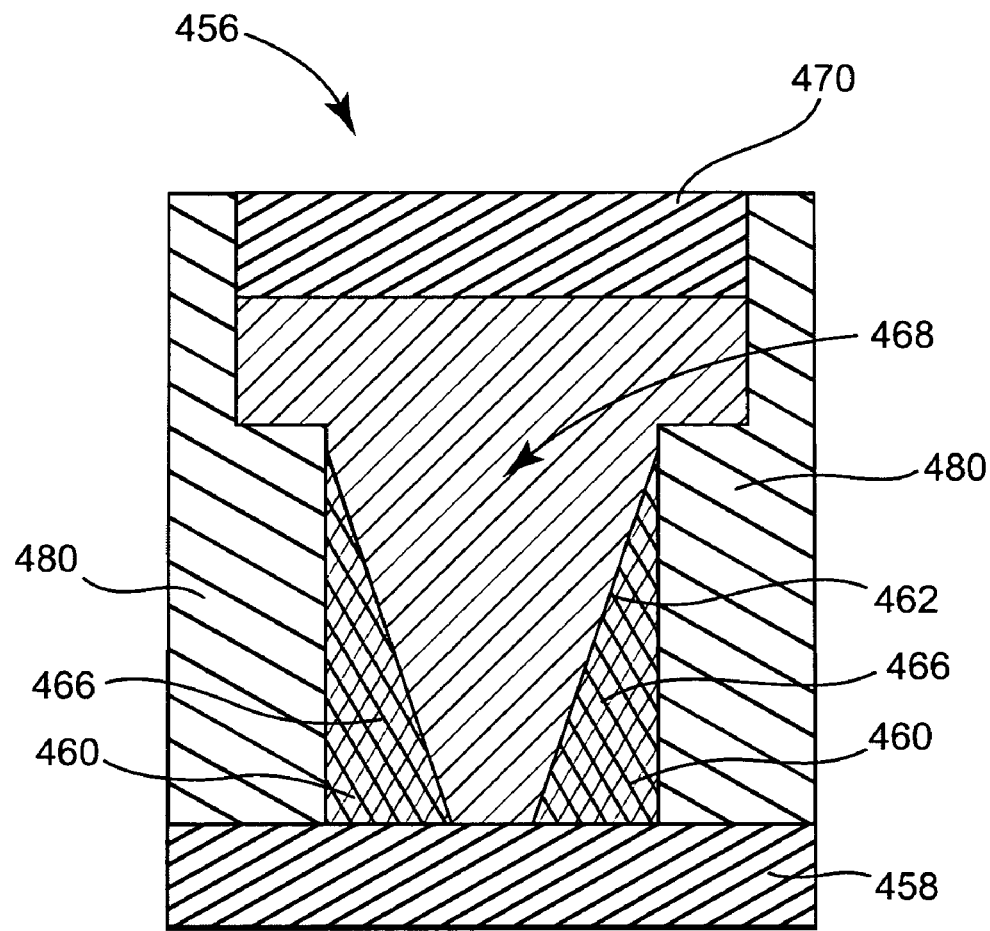
FIG. 10 illustrates a cross-sectional view of a mushroom-in-via memory cell including an encapsulation layer according to one embodiment of the present invention.

FIG. 10 illustrates a cross-sectional view of mushroom-in-via memory cell 456 including an encapsulation layer 480 according to one embodiment of the present invention.

Memory cell 456 includes phase change memory element 468 extending between first electrode 458 and second electrode 470, and an insulator 460 infiltrated with phase change material 466 that forms a nanocomposite insulator. In one embodiment, encapsulation layer 480 surrounds memory cell 456 and phase change material 466 diffuses through an entirety of insulator 460 to form a nanocomposite insulator. In one embodiment, encapsulation layer 480 is a low-k dielectric layer deposited employing a CVD, ALD, MOCVD, PVD, JVD, or other suitable deposition technique.

Figure 11:
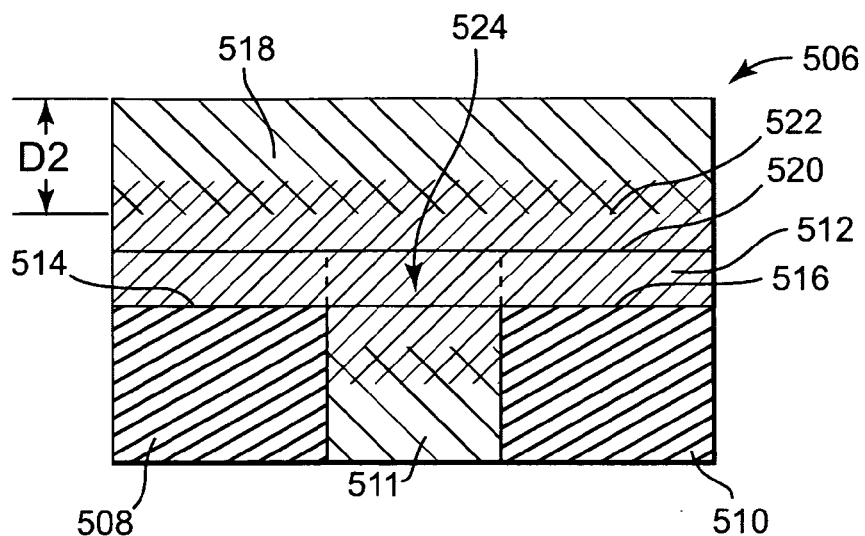
FIG. 11 illustrates a cross-sectional view of a line cell memory cell according to one embodiment of the invention.

FIG. 11 illustrates a cross-sectional view of a line cell memory cell 506 according to one embodiment of the present invention. Memory cell 506 includes a first electrode 508, a second electrode 510 separated from first electrode 508 by a dielectric insulator 511, a phase change memory element 512 extending from a first contact 514 with first electrode 508 to a second contact 516 with second electrode 510, and an insulator 518 contacting phase change memory element 512 along an insulator interface 520. In one embodiment, insulator 518 is a nanoporous insulator and a portion of insulator 518 is infiltrated with a phase change material 522 to form a nanocomposite insulator.

Memory cell 506 includes upper and lower layers having, for example, a word line, a bit line, and a ground line that electrically connect memory cell 506 to other memory cells in memory device 100 (FIG. 1). For ease of illustration, upper and lower layers are not illustrated in FIGS. 11-14. In one embodiment, line cell memory cell 506 is a bridge cell memory cell.

A current path is defined through phase change memory element 512 extending from first contact 514 of first electrode 508 through an active region 524 of element 512 to second contact 516 of second electrode 510 (i.e., the current path is oriented horizontally relative to the orientation of FIG. 11). Phase change memory element 512 is laterally enclosed by nanoporous insulator 518, such that insulator 518 laterally insulates active region 524 perpendicular to the current path.

In one embodiment, insulator 518 is inert, and includes phase change material 522 that is the same as a phase change material of phase change memory element 512. In another embodiment, insulator 518 includes phase change material 522 that is different than phase change material employed in phase change memory element 512. In this regard, insulator 518 is similar to nanocomposite insulator 218 described above in FIGS. 2 and 4.

In one embodiment, electrodes 508, 510 are similar to electrodes 208/210 (FIG. 2) and include titanium nitride (TiN), tungsten (W), or other suitable electrode material. In one embodiment, first electrode 508 is an electrode plug including TiN, a tungsten plug, a copper plug, or a plug of other suitable electrode material.

In one embodiment, phase change element 512 includes a chalcogenide alloy phase change material having one or more elements from Group VI of the Periodic Table. For example, in one embodiment phase change material of element 512 includes a chalcogenide compound such as GeSbTe, SbTe, GeTe, or AgInSbTe. In another embodiment, the phase change material of element 512 is chalcogen-free, and includes GeSb, GaSb, InSb, or GeGaInSb. In other embodiments, the phase change material of phase change memory element 512 includes suitable phase change material having one or more of the elements Ge, Sb, Te, Ga, As, In, Se, and S.

In one embodiment, nanocomposite insulator 518 includes a host material and a nano-scaled material distributed within a portion of the host material. In another embodiment, the host material includes a phase change material and the nano-scaled material includes insulating nanoparticles distributed within host material, such as illustrated in FIG. 3A above. In another embodiment, the host material includes a nanoporous insulator and the nano-scaled material includes particles infiltrated into the nano-sized pores of the porous insulator.

For example, in one embodiment insulator 518 is a porous host matrix characterized by an inert and electrically insulating material, substantially similar to nanocomposite insulator 218 (FIG. 2). In one embodiment, nanoporous insulator 518 includes a porous matrix of $SiO_2$, $GeO_x$, $Al_2O_3$, SiN, SiON, or SiOCH and is infiltrated with a phase change material 522. In one embodiment, phase change material 522 is the same phase change material contained within the phase change memory element 512. In another embodiment, phase change material 522 is a different phase change material than the material used in phase change memory element 512.

In one embodiment, insulator 518 is nanoporous and defines a thickness D2 of between about 10-50 nm and includes a matrix of pores that define a pore size of between about 1-5 nm. In one embodiment, a portion of the matrix of pores, preferably adjacent to interface 520, is infused/infiltrated with phase change material 522. In another embodiment, an entirety of the matrix of pores is infused/infiltrated with phase change material 522.

In one embodiment phase change memory element 512 includes a chalcogenide material, and phase change material 522 includes the same chalcogenide material. In another embodiment, phase change memory element 512 includes a chalcogenide material, and phase change material 522 includes a different chalcogenide material. In one embodiment, phase change memory element 512 includes a chalcogen-free material, and phase change material 522 of nanoporous insulator 518 includes the same chalcogen-free material. In another embodiment, phase change memory element 512 includes chalcogen-free material, and phase change material 522 of nanoporous insulator 518 includes a different chalcogen-free material. In another embodiment, phase change memory element 512 includes a chalcogen material, and phase change material 522 of nanoporous insulator 518 includes a chalcogen-free material. In another embodiment, phase change memory element 512 includes a chalcogen-free material, and phase change material 522 of nanoporous insulator 518 includes a chalcogenide.

In one embodiment, phase change memory change element 512 includes phase change material that is deposited onto electrodes 508, 510 and dielectric 511. A subsequent deposition of insulator 518 onto phase change memory element 512 initiates an inter diffusion from the phase change material of the phase change memory element 512 into, for example, the nanoporous insulator 518. In this manner, nanoporous insulator 518 is infiltrated with phase change material 522 to form a nanocomposite insulator.

In one embodiment, diffusion of the phase change material from phase change memory element 512 is increased/controlled by additional processing, such as rapid thermal processing. In one embodiment, memory cell 506 provides diffusion of phase change material in a one-sided manner from phase change memory element 512 to the nanoporous insulator 518. In this regard, dielectric 511 is substantially resistant to intra diffusion of phase change material. In one embodiment, dielectric 511 is a diffusion blocking layer.

Figure 12:
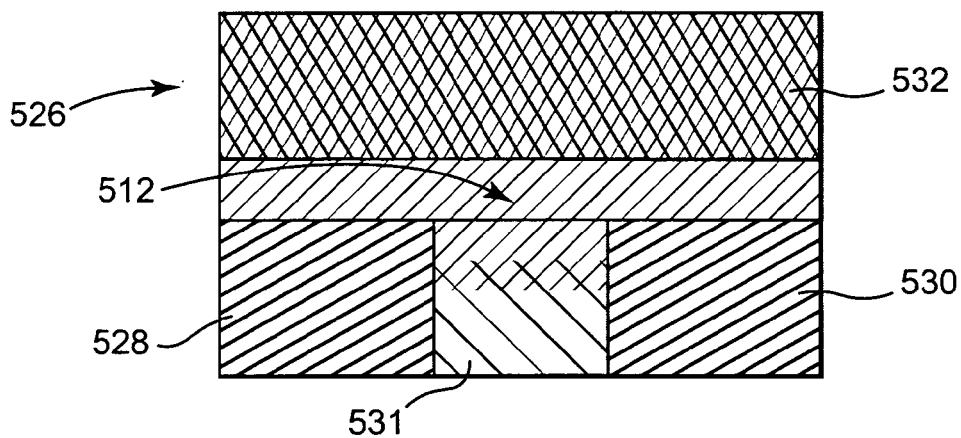
FIG. 12 illustrates a cross-sectional view of a line cell memory cell according to another embodiment of the present invention.

FIG. 12 illustrates a cross-sectional view of a line cell memory cell/heater cell 526 according to another embodiment of the present invention. Memory cell 526 includes a first electrode 528 separated from a second electrode 530 by a dielectric layer 531, a phase change memory element 512 extending between electrodes 528, 530, and a volume of nano-compound alloy 532 deposited to contact memory element 512. In one embodiment, nano-compound alloy 532 includes phase change memory material and an insulator material substantially similar to the material described in FIGS. 3A-3B above, and both components are deposited in a single deposition of nano-compound alloy 532, likewise similar to the processing of nano-compound alloy 262 described above in FIGS. 3A-3B.

In one embodiment, nano-compound alloy 532 is a nanocomposite insulator that includes an alloy of phase change material and insulating material deposited in a single deposition process. In one embodiment, nano-compound alloy 532 includes a phase change host material selected from one of the suitable phase change materials identified above, for example a compound including one or more of the elements Ge, Sb, Te, Ga, As, In, Se, and S, and an insulator material selected from a suitable insulator material, for example, SiO2, GeO$_x$, GeN, or SiN material, that embeds as nanoparticles of insulator within the phase change host material.

In one embodiment, nano-compound alloy 532 includes a GST (i.e., Ge$_x$Sb$_x$Te$_x$) phase change material having high alloy levels of oxygen, or high levels of silicon dioxide. In one embodiment, germanium oxide nano-scaled particles precipitate from the nano-compound alloy 562 such that the GST phase change host material is segregated to form an inert oxygenated matrix including nanoparticles of insulator materials. For example, in one embodiment nano-compound alloy 562 of GeSbTe:O is deposited to contact memory element 512 in a single process, and nanoparticles of GeO insulators are precipitated into the remaining phase change host material matrix to form a nanocomposite insulator having low thermal conductivity. In another embodiment, nano-compound alloy 532 is an alloy of GST:SiO$_2$, and a precipitate of germanium oxide (GeO) nanoparticles are distributed within a phase change host material matrix to form a nanocomposite insulator having low thermal conductivity.

Figure 13:
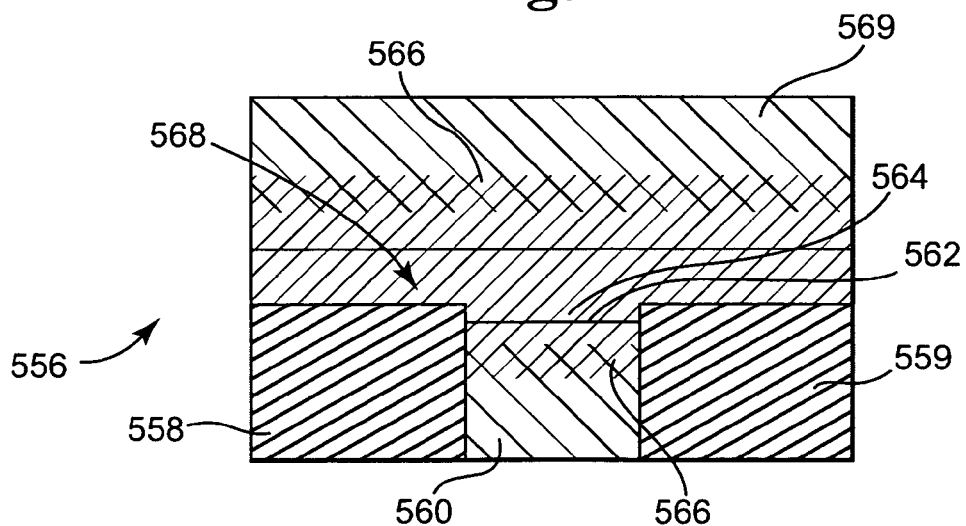
FIG. 13 illustrates a cross-sectional view of a line cell memory cell according to another embodiment of the present invention.

FIG. 13 illustrates a cross-sectional view of a line cell memory cell 556 according to another embodiment of the present invention. Memory cell 556 includes electrode 558, 559 upon which various other layers of memory cell 556 are fabricated.

For example, in one embodiment a layer 560 of insulator is deposited between electrodes 558, 559 and is etched, for example lithographically etched, and/or processed to define a face 562. In one embodiment, layer 560 is a nanoporous insulator. In one embodiment, phase change material 564 is deposited onto face 562 of nanoporous insulator 560 by a suitable deposition process, such as ALD, CVD, PVD, or deposited by another suitable deposition technique.

In one embodiment, a monolayer of phase change material 564 is deposited onto face 562 of nanoporous insulator 560 by atomic layer deposition (ALD). During such ALD deposition, the phase change material 564 diffuses into the nanoporous insulator 560 monolayer-per-monolayer to selectively infiltrate nanoporous insulator 560 with phase change material 566.

In one embodiment, a phase change material 564 is deposited onto face 562, and an additional nanoporous insulator 569 is deposited onto phase change material 564. Subsequent thermal cycling or thermal annealing is applied to further enhance diffusion of phase change material 566 into nanoporous insulators 560, 569. In one embodiment, phase change material 564 is deposited onto face 562 to define a phase change memory element 568.

Figure 14:
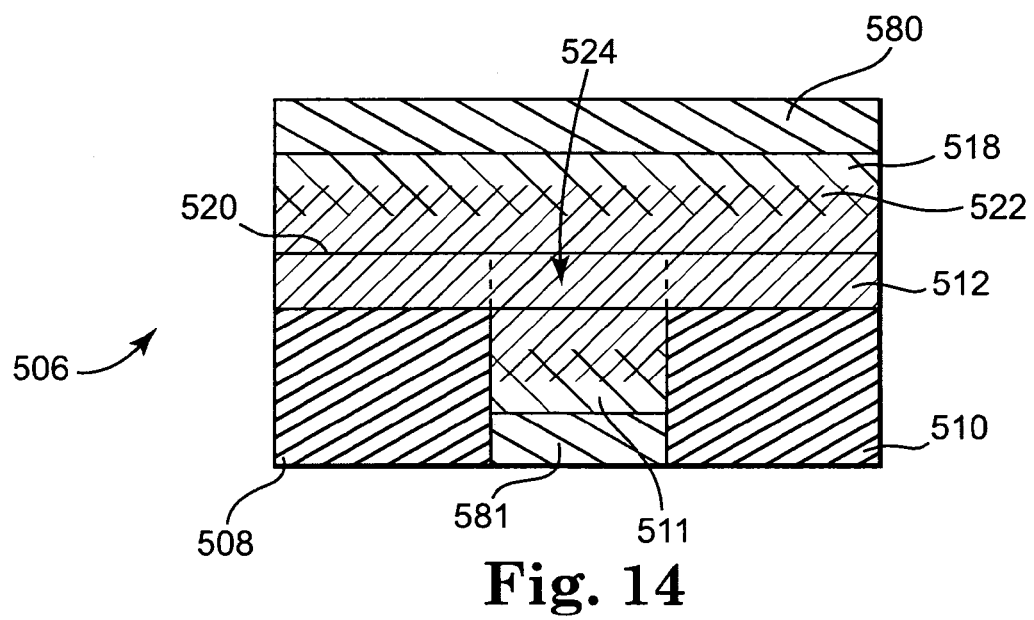
FIG. 14 illustrates a cross-sectional view of a line cell memory cell including an encapsulation layer according to one embodiment of the present invention.

FIG. 14 illustrates a cross-sectional view of a line cell memory cell 506 including an encapsulation layer 580 according to one embodiment of the present invention. In one embodiment, memory cell 506 is similar to memory cell 506 illustrated in FIG. 11, and includes an encapsulation layer 580 that minimizes diffusion of phase change material 522 from phase change memory element 512 through nanoporous insulator 518.

In one embodiment, encapsulation layers 580, 581 surround active region 524 to minimize diffusion of phase change material 522 from phase change memory element 512 through insulators 511, 518. In one embodiment, encapsulation layers 580, 581 surround active region 524 and phase change material 522 diffuses through an entirety of insulators 511, 518. In one embodiment, encapsulation layers 580, 581 are low-k dielectric layer deposited employing a CVD, ALD, MOCVD, PVD, JVD, or other suitable deposition technique.

Figure 15:
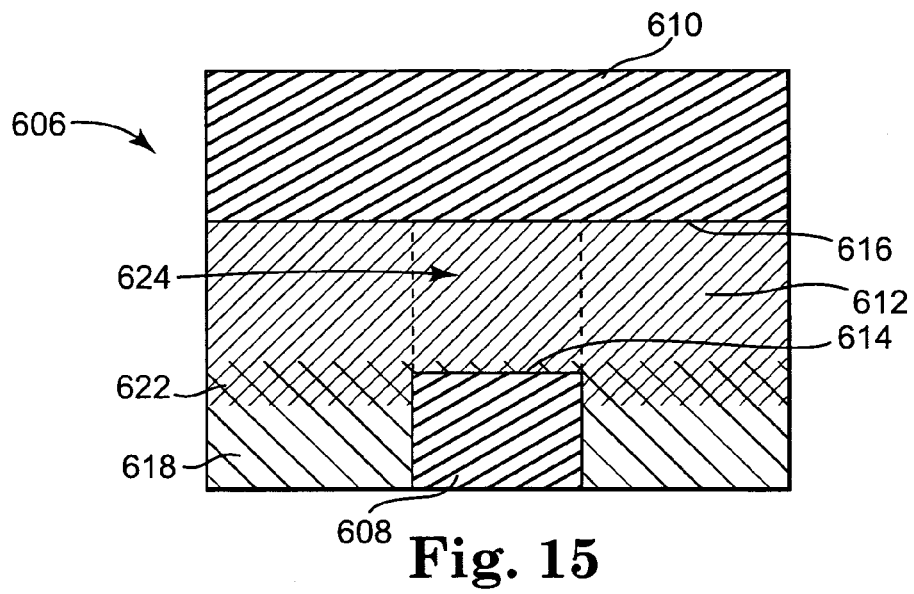
FIG. 15 illustrates a cross-sectional view of a mushroom cell according to one embodiment of the present invention.

FIG. 15 illustrates a cross-sectional view of a mushroom cell memory cell 606 according to one embodiment of the present invention. Memory cell 606 includes a first electrode 608, a second electrode 610, a phase change memory element 612 extending from a first contact 614 with first electrode 608 to a second contact 616 with second electrode 610, and an insulator 618 contacting phase change memory element 612. In one embodiment, a portion of insulator 618 is infiltrated with a phase change material 622 to form a nanocomposite insulator. In another embodiment, insulator includes a host material and a nano-scaled material distributed within a portion of the host material.

Memory cell 606 includes upper and lower layers having, for example, a word line, a bit line, and a ground line that electrically connect memory cell 606 to other memory cells in memory device 100 (FIG. 1). For ease of illustration, upper and lower layers are not illustrated in FIGS. 15-18.

A current path is defined through phase change memory element 612 extending from first contact 614 of first electrode 608 through an active region 624 of element 612 to the second contact 616 of second electrode 610. Nanocomposite insulator 618 laterally insulates at least a portion of phase change memory element 612.

In one embodiment, nanocomposite insulator 618 includes a host material and a nano-scaled material distributed within a portion of the host material. In another embodiment, the host material includes a phase change material and the nano-scaled material includes insulating nanoparticles distributed within host material, such as illustrated in FIG. 3A above. In another embodiment, the host material includes a nanoporous insulator and the nano-scaled material includes particles infiltrated into the nano-sized pores of the porous insulator.

In one embodiment, electrodes 608, 610 are similar to electrodes 208/210 (FIG. 2) and include titanium nitride (TiN), tungsten (W), or other suitable electrode material. In one embodiment, first electrode 608 is an electrode plug including TiN, a tungsten plug, a copper plug, or a plug of other suitable electrode material.

In one embodiment, phase change element 612 includes a chalcogenide alloy phase change material having one or more elements from Group VI of the Periodic Table. For example, in one embodiment phase change material of element 612 includes a chalcogenide compound such as GeSbTe, SbTe, GeTe, or AgInSbTe. In another embodiment, the phase change material of element 612 is chalcogen-free, and includes GeSb, GaSb, InSb, or GeGaInSb. In other embodiments, the phase change material of phase change memory element 612 includes suitable phase change material having one or more of the elements Ge, Sb, Te, Ga, As, In, Se, and S.

In one embodiment, insulator 618 is a porous host matrix characterized by an inert and electrically insulating material, substantially similar to nanocomposite insulator 218 (FIG. 2). In one embodiment, nanoporous insulator 618 includes a matrix of SiO2, GeO$_x$, Al$_2$O$_3$, SiN, SiON, or SiOCH and is infiltrated with a phase change material 622 to form a nanocomposite insulator. In one embodiment, phase change material 622 is the same phase change material contained within the phase change memory element 612. In another embodiment, phase change material 622 is a different phase change material than the material used in phase change memory element 612.

In one embodiment, insulator 618 is porous and includes a matrix of pores, where the pore size of between about 1-5 nm, and insulator 618 defines a thickness of between about 10-50 nm, where at least a portion of the thickness is infused with phase change material. In one embodiment, a portion of the matrix of pores is infused/infiltrated with phase change material 622. In another embodiment, an entirety of the matrix of pores is infused/infiltrated with phase change material 622.

In one embodiment phase change memory element 612 includes a chalcogenide material, and phase change material 622 includes the same chalcogenide material. In another embodiment, phase change memory element 612 includes a chalcogenide material, and phase change material 622 includes a different chalcogenide material. In one embodiment, phase change memory element 612 includes a chalcogen-free material, and phase change material 622 of nanoporous insulator 618 includes the same chalcogen-free material. In another embodiment, phase change memory element 612 includes chalcogen-free material, and phase change material 622 of nanoporous insulator 618 includes a different chalcogen-free material. In another embodiment, phase change memory element 612 includes a chalcogen material, and phase change material 622 of nanoporous insulator 618 includes a chalcogen-free material. In another embodiment, phase change memory element 612 includes a chalcogen-free material, and phase change material 622 of nanoporous insulator 618 includes a chalcogenide.

In one embodiment, phase change memory change element 612 includes phase change material that is deposited between electrodes 608, 610 and onto nanoporous insulator 618. After deposition of phase change memory element 612, an inter diffusion of the phase change material of the phase change memory element 612 into the nanoporous insulator 618 is initiated. In this manner, nanoporous insulator 618 is infiltrated with phase change material 622.

In one embodiment, diffusion of the phase change material from phase change memory element 612 is increased/controlled by additional processing, such as rapid thermal processing. In one embodiment, memory cell 606 provides diffusion of phase change material in a one-sided manner from phase change memory element 612 to the nanoporous insulator 618.

Figure 16:
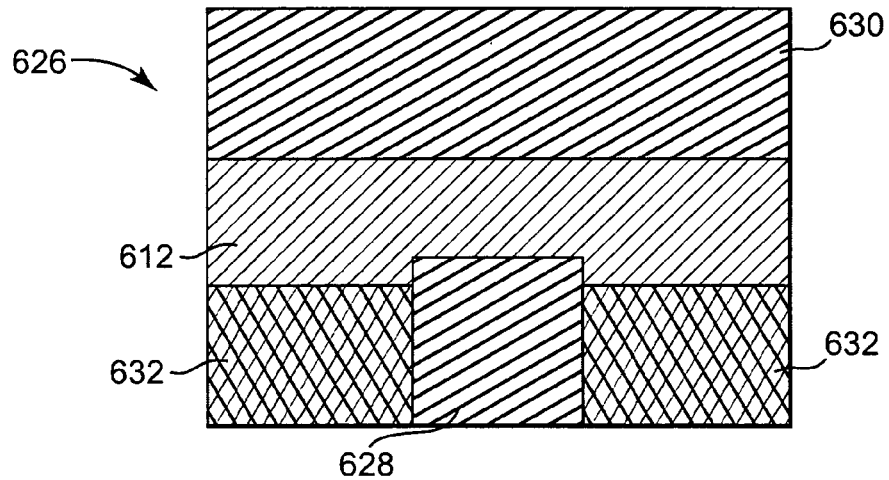
FIG. 16 illustrates a cross-sectional view of a mushroom cell according to another embodiment of the present invention.

FIG. 16 illustrates a cross-sectional view of a mushroom cell memory cell 626 according to another embodiment of the present invention. Memory cell 626 includes a first electrode 628 and a second electrode 630, a phase change memory element 612 extending between electrodes 628, 630, and a nano-compound alloy 632 deposited in contact with phase change memory element 612.

In one embodiment, nano-compound alloy 632 includes phase change memory material and an insulator material substantially similar to the material described in FIGS. 3A-3B above, and both components are deposited in a single deposition of nano-compound alloy 632, likewise similar to the processing of nano-compound alloy 262 described above in FIGS. 3A-3B.

In one embodiment, nano-compound alloy 632 is a nanocomposite insulator that includes an alloy of phase change material and insulating material deposited in a single deposition process. In one embodiment, nano-compound alloy 632 includes a phase change host material selected from one of the suitable phase change materials identified above, for example a compound including one or more of the elements Ge, Sb, Te, Ga, As, In, Se, and S, and an insulator material selected from a suitable insulator material, for example, SiO2, GeO$_x$, GeN, or SiN material, that embeds as nanoparticles of insulator within the phase change host material.

In one embodiment, nano-compound alloy 632 includes a GST (i.e., Ge$_x$Sb$_x$Te$_x$) phase change material having high alloy levels of oxygen, or high levels of silicon dioxide. In one embodiment, germanium oxide nano-scaled particles are precipitated from the nano-compound alloy 632 such that the GST phase change host material is segregated to form an inert oxygenated matrix including nanoparticles of insulator materials. For example, in one embodiment nano-compound alloy 632 of GeSbTe:O is deposited to contact memory element 612 in a single process, and nanoparticles of GeO insulators are precipitated into the remaining phase change host material matrix to form a nanocomposite insulator having low thermal conductivity. In another embodiment, nano-compound alloy 632 is an alloy of GST:SiO$_2$, and a precipitate of germanium oxide (GeO) nanoparticles are distributed within a phase change host material matrix to form a nanocomposite insulator having low thermal conductivity.

Figure 17:
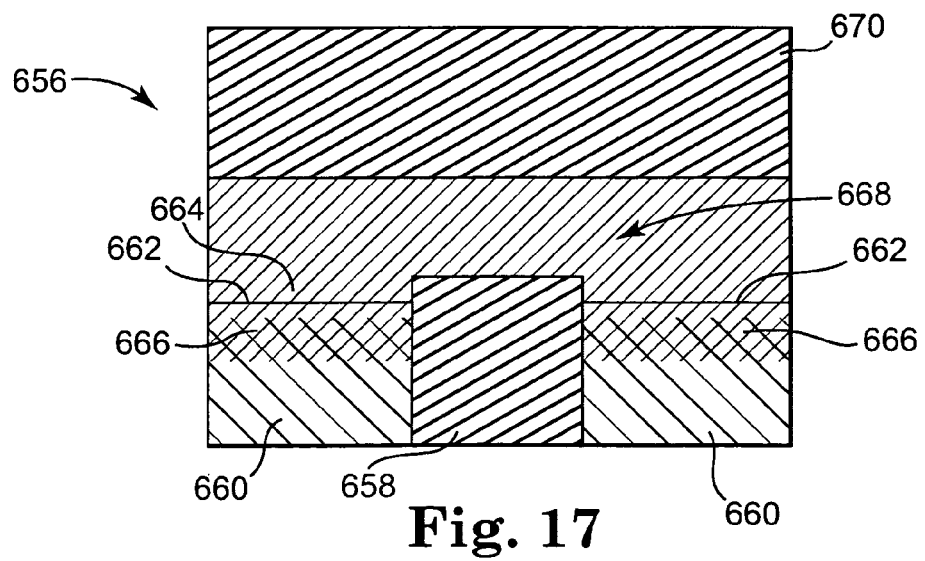
FIG. 17 illustrates a cross-sectional view of a mushroom cell according to another embodiment of the present invention.

FIG. 17 illustrates a cross-sectional view of a mushroom cell memory cell 656 according to another embodiment of the present invention. Memory cell 656 includes a first electrode 658, a second electrode 670, a phase change memory element 668 extending between first electrode 658 to second electrode 670, and an insulator 660 contacting phase change memory element 668. In one embodiment, insulator 660 is porous and a portion of porous insulator 660 is infiltrated with a phase change material 666 to form a nanocomposite insulator.

For example, in one embodiment a layer 660 of nanoporous insulator is etched, for example lithographically etched, and/or processed to define a face 662. In one embodiment, phase change material 664 is deposited onto face 662 of nanoporous insulator 660 by a suitable deposition process, such as ALD, CVD, PVD, or deposited by another suitable deposition technique.

In one embodiment, a monolayer of phase change material 664 is deposited onto face 662 of nanoporous insulator 660 by atomic layer deposition (ALD). During such ALD deposition, the phase change material 664 diffuses into the nanoporous insulator 660 monolayer per monolayer to selectively infiltrate nanoporous insulator 660 with phase change material 666 and form a nanocomposite insulator.

In one embodiment, a phase change material 666 is deposited onto face 662, and a subsequent thermal cycling or thermal annealing is applied to further enhance diffusion of phase change material 666 into nanoporous insulators 660. In one embodiment, additional phase change material 666 is deposited over face 662 to define a phase change memory element 668. In any regard, a nanocomposite insulator is formed at the interface between memory element 668 and insulator 660 that has little if any gap, and is thus highly thermally insulating.

Figure 18:
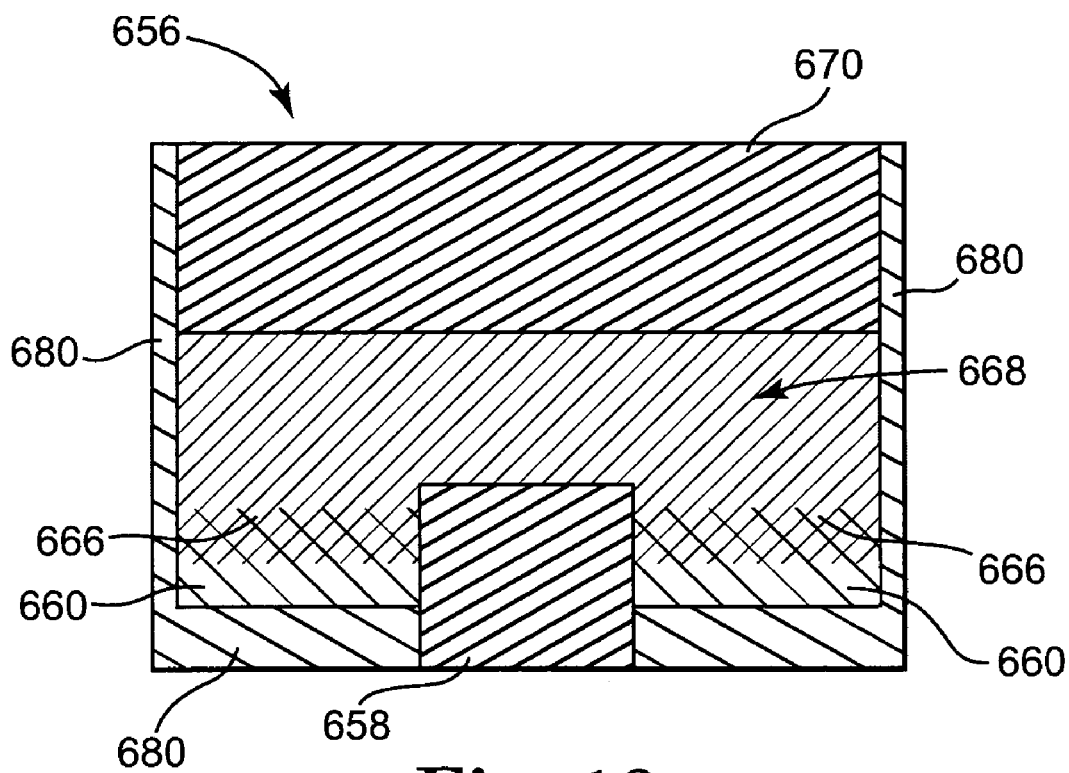
FIG. 18 illustrates a cross-sectional view of a mushroom cell memory cell including an encapsulation layer according to one embodiment of the present invention.

FIG. 18 illustrates a cross-sectional view of a mushroom cell memory cell 656 including an encapsulation layer 680 according to one embodiment of the present invention. In one embodiment, memory cell 656 is similar to memory cell 656 illustrated in FIG. 17, and includes an encapsulation layer 680 that minimizes diffusion of phase change material from phase change memory element 668 through nanoporous insulator 660.

In one embodiment, encapsulation layer 680 surrounds active region of phase change memory element 668 between electrodes 658, 670 and phase change material 666 diffuses through an entirety of insulator 660. In one embodiment, encapsulation layer 680 is a low-k dielectric layer deposited employing a CVD, ALD, MOCVD, PVD, JVD, or other suitable deposition technique.

Various embodiments of phase change memory cells have been described that include a porous insulator infiltrated with phase change memory material that effectively insulates the hot spots in phase change memory cells. Such phase change memory cells provided with the porous insulator draw less power in changing memory states in memory cells, which enables the use of smaller selection devices, and thus reduces an overall size for memory devices.

A nanocomposite insulator has been described that includes a host material and a nano-scaled material distributed within a portion of the host material. One embodiment includes a porous insulator having nano-pores that are infiltrated with a nano-pore-sized phase change material. In this regard, the nano-pores are selected to have a length scale that is approximately equal to the wavelength of phonons of energy associated with heat generation during memory changes in the memory cells. Another embodiment of a nanocomposite insulator includes a host phase change material matrix having insulating nanoparticles distributed within the matrix. In general, the nano-sized material of the nanocomposite insulator very effectively scatters phonons having a wavelength of that associated with heat generated in a memory cell, thus effectively lowering the thermal conductivity of the nanocomposite insulator. As a result, a phase change memory element in the memory cell will experience a near maximum resistance after RESET, which leads to a desirably large signal contrast.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell comprising:
   a first electrode;
   a second electrode;
   a storage material positioned between the first electrode and the second electrode; and
   a nanocomposite insulator contacting the storage material;
   wherein the nanocomposite insulator comprises a first material comprising a phase change material and a nano-scaled material comprising insulating nanoparticles distributed within a portion of the first material.

2. The memory cell of claim 1, wherein the storage material is a phase change memory material.

3. The memory cell of claim 1, wherein the nanocomposite insulator comprises a nanocomposite cluster defining a cluster size of between about 1-5 nm.

4. The memory cell of claim 1, wherein the nanocomposite insulator is deposited as a layer having a thickness of between about 5-30 nm.

5. The memory cell of claim 1, wherein the memory cell comprises a via cell.

6. The memory cell of claim 1, wherein the memory cell comprises a pillar cell.

7. The memory cell of claim 1, wherein the memory cell comprises a line device.

8. The memory cell of claim 1, wherein the memory cell comprises a heater cell.

9. The memory cell of claim 1, wherein the first material comprises a porous insulator host and the nano-scaled material comprises nanoparticles of phase change material infiltrated into the porous insulator host.

10. The memory cell of claim 9, wherein the porous insulator host is a nanoporous insulator including pores that defines a pore size of between about 1-5 nm.

11. The memory cell of claim 9, wherein the storage material comprises a phase change material and the porous insulator is infiltrated with nanoparticles of the same phase change material.

12. The memory cell of claim 9, wherein the storage material comprises a phase change material and the porous insulator is infiltrated with nanoparticles of a different phase change material.

13. The memory cell of claim 1, wherein the nanocomposite insulator comprises a combined thermal conductivity that is lower than a first thermal conductivity of the first material and lower than a second thermal conductivity of the nano-scaled material.

14. A memory cell comprising:
    a first electrode;
    a second electrode;
    a memory element including storage material extending from a first contact with the first electrode to a second contact with the second electrode; and
    a nanoporous insulator comprising phase change material contacting the memory element, wherein at least a portion of the nanoporous insulator is formed by a diffusion of the storage material into a porous material.

15. The memory cell of claim 14, wherein the storage material is a phase change material.

16. The memory cell of claim 14, wherein the nanoporous insulator comprises a nanocomposite cluster defining a cluster size of between about 1-5 nm.

17. The memory cell of claim 14, wherein the nanoporous insulator is deposited as a layer having a thickness of between about 5-30 nm.

18. The memory cell of claim 14, wherein the memory cell comprises a via cell.

19. The memory cell of claim 14, wherein the memory cell comprises a pillar cell.

20. The memory cell of claim 14, wherein the memory cell comprises a line device.

21. The memory cell of claim 14, wherein the memory cell comprises a heater cell.

22. The memory cell of claim 14, wherein the nanoporous insulator contacts the memory element along an insulator interface, and a portion of the nanoporous insulator adjacent to the insulator interface is infiltrated with the phase change material.

23. The memory cell of claim 22, further comprising:
    a dielectric layer encapsulating the nanoporous insulator, wherein the dielectric layer minimizes diffusion of the phase change material from the insulator interface through the nanoporous insulator.

24. The memory cell of claim 14, wherein a thickness of the nanoporous insulator is between about 10-50 nm, and a pore size of the nanoporous insulator is between about 1-5 nm.

25. The memory cell of claim 14, wherein the memory element defines an active region between the first and second electrodes, and the nanoporous insulator surrounds the memory element laterally about the active region.

26. The memory cell of claim 14, wherein the storage material of the memory element comprises one of a chalcogenide material and a chalcogen-free material, and the nanoporous insulator comprises a chalcogenide.

27. The memory cell of claim 14, wherein the storage material of the memory element comprises one of a chalcogenide material and a chalcogen-free material, and the nanoporous insulator comprises a chalcogen-free material.

28. The memory cell of claim 14, wherein the nanoporous insulator comprises a host phase change material and a nano-scaled material distributed within a portion of the host phase change material.

29. The memory cell of claim 14, wherein the storage material comprises a phase change material and the nanoporous insulator is infiltrated with nanoparticles of the same phase change material.

30. A memory cell comprising:
a first electrode;
a second electrode;
a phase change memory element extending from a first contact with the first electrode to a second contact with the second electrode;
an insulator contacting the phase change memory element, the insulator comprising phase change material; and
means for reducing the thermal conductivity of the insulator.

31. The memory cell of claim 30, wherein the insulator is a nanocomposite insulator including a phase change host material, and the means for reducing the thermal conductivity of the insulator comprises a nano-scaled material distributed within a portion of the phase change host material.

32. The memory cell of claim 30, wherein the insulator is a nanoporous insulator, and the means for reducing the thermal conductivity of the insulator comprises nanoparticles dispersed within the nanoporous insulator.

33. The memory cell of claim 32, wherein the phase change memory element comprises a phase change material and the nanoparticles comprise the same phase change material.

34. The memory cell of claim 32, wherein the phase change memory element is energized during a memory set/reset by energy generating heat having phonons having a phonon wavelength, and the nanoparticles define a length dimension approximately equal to or less than the phonon wavelength.

35. The memory cell of claim 34, wherein the length dimension is between about 1-5 nm.

36. A memory device comprising:
a distribution circuit;
a write pulse generator electrically coupled to the distribution circuit;
a sense circuit electrically coupled to the distribution circuit and electrically coupled to the write pulse generator through a signal path; and
an array of memory cells electrically coupled to the distribution circuit, each memory cell including opposing electrodes and comprising:
a phase change memory element extending between the opposing electrodes,
a nanocomposite insulator surrounding the phase change memory element;
wherein the nanocomposite insulator comprises a host material comprising a phase change material and a nano-scaled material distributed within a portion of the host material.

37. The memory device of claim 36, wherein the nano-scaled material comprises insulating nanoparticles.

38. The memory device of claim 37, wherein the insulating nanoparticles are precipitated into the host material.

39. An integrated circuit including a memory cell comprising:
a first electrode;
a second electrode;
a storage material positioned between the first electrode and the second electrode; and
a nanocomposite insulator contacting the storage material, wherein the storage material comprises a phase change material, and the nanocomposite insulator comprises a porous insulator infiltrated with nanoparticles of the same phase change material.

* * * * *